(12) United States Patent
Lopatin

(10) Patent No.: US 6,518,648 B1
(45) Date of Patent: Feb. 11, 2003

(54) SUPERCONDUCTOR BARRIER LAYER FOR INTEGRATED CIRCUIT INTERCONNECTS

(75) Inventor: Sergey D. Lopatin, Santa Clara, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/671,944

(22) Filed: Sep. 27, 2000

(51) Int. Cl.[7] .................. H01L 39/00; H01L 23/48
(52) U.S. Cl. .............. 257/663; 257/774; 257/758; 257/751
(58) Field of Search ................ 257/758–751, 257/774, 661, 663; 505/1

(56) References Cited

U.S. PATENT DOCUMENTS 4,960,751 A * 10/1990 Yamazaki .................. 505/1
5,358,925 A * 10/1994 Neville Connell et al. . 505/235
6,096,565 A * 8/2000 Goland et al. ............ 438/2
6,274,899 B1 * 8/2001 Melnick et al. ........... 257/298

FOREIGN PATENT DOCUMENTS

JP        2-62081   *   3/1990   .......... H01L/39/22

* cited by examiner

Primary Examiner—Tom Thomas
Assistant Examiner—Ori Nadav
(74) Attorney, Agent, or Firm—Mikio Ishimaru

(57) ABSTRACT

An integrated circuit and manufacturing method therefor is provided having a semiconductor substrate with a semiconductor device. A dielectric layer is on the semiconductor substrate and has an opening provided therein. A high temperature superconductor material barrier layer lines the opening and a seed layer is deposited to line the superconductor material barrier layer. A seed layer and a conductor core fills the opening over the barrier layer to form a conductor channel. The superconductor material barrier layer can be of yttrium barium copper oxide deposited by a process, such as laser ablation (LA), chemical vapor deposition (CVD), atomic layer deposition (ALD), or self-ionized plasma (SIP) deposition on a low dielectric constant dielectric layer and having a copper seed layer deposited thereon by SIP deposition.

10 Claims, 2 Drawing Sheets

SUPERCONDUCTOR BARRIER LAYER FOR INTEGRATED CIRCUIT INTERCONNECTS

TECHNICAL FIELD

The present invention relates generally to semiconductor technology and more specifically to barrier materials for preventing copper diffusion in semiconductor devices.

BACKGROUND ART

In the manufacture of integrated circuits, after the individual devices such as the transistors have been fabricated in and on the semiconductor substrate, they must be connected together to perform the desired circuit functions. This interconnection process is generally called "metallization" and is performed using a number of different photolithographic, deposition, and removal techniques.

In one interconnection process, which is called a "dual damascene" technique, two channels of conductor materials are separated by interlayer dielectric layers in vertically separated planes perpendicular to each other and interconnected by a vertical connection, or "via", at their closest point. The dual damascene technique is performed over the individual devices which are in a device dielectric layer with the gate and source/drain contacts, extending up through the device dielectric layer to contact one or more channels in a first channel dielectric layer.

The first channel formation of the dual damascene process starts with the deposition of a thin first channel stop layer. The first channel stop layer is an etch stop layer which is subject to a photolithographic processing step which involves deposition, patterning, exposure, and development of a photoresist, and an anisotropic etching step through the patterned photoresist to provide openings to the device contacts. The photoresist is then stripped. A first channel dielectric layer is formed on the first channel stop layer. Where the first channel dielectric layer is of an oxide material, such as silicon oxide ($SiO_2$), the first channel stop layer is a nitride, such as silicon nitride (SiN), so the two layers can be selectively etched.

The first channel dielectric layer is then subject to further photolithographic process and etching steps to form first channel openings in the pattern of the first channels. The photoresist is then stripped.

An optional thin adhesion layer is deposited on the first channel dielectric layer and lines the first channel openings to ensure good adhesion of subsequently deposited material to the first channel dielectric layer. Adhesion layers for copper (Cu) conductor materials are composed of compounds such as tantalum nitride (TaN), titanium nitride (TiN), or tungsten nitride (WN).

These nitride compounds have good adhesion to the dielectric materials and provide good barrier resistance to the diffusion of copper from the copper conductor materials to the dielectric material. High barrier resistance is necessary with conductor materials such as copper to prevent diffusion of subsequently deposited copper into the dielectric layer, which can cause short circuits in the integrated circuit.

However, these nitride compounds also have relatively poor adhesion to copper and relatively high electrical resistance.

Because of the drawbacks, pure refractory metals such as tantalum (Ta), titanium (Ti), or tungsten (W) are deposited on the adhesion layer to line the adhesion layer in the first channel openings. The refractory metals are good barrier materials, have lower electrical resistance than their nitrides, and have good adhesion to copper.

In some cases, the barrier material has sufficient adhesion to the dielectric material that the adhesion layer is not required, and in other cases, the adhesion and barrier material become integral. The adhesion and barrier layers are often collectively referred to as a "barrier" layer herein.

For conductor materials such as copper, which are deposited by electroplating, a seed layer is deposited on the barrier layer and lines the barrier layer in the first channel openings. The seed layer, generally of copper, is deposited to act as an electrode for the electroplating process.

A first conductor material is deposited on the seed layer and fills the first channel opening. The first conductor material and the seed layer generally become integral, and are often collectively referred to as the conductor core when discussing the main current-carrying portion of the channels.

A chemical-mechanical polishing (CMP) process is then used to remove the first conductor material, the seed layer, and the barrier layer above the first channel dielectric layer to form the first channels. When a layer is placed over the first channels as a final layer, it is called a "cap" layer and a "single" damascene process is completed. When the layer is processed further for placement of additional channels over it, the layer is a via stop layer.

The via formation step of the dual damascene process begins with the deposition of a thin via stop layer over the first channels and the first channel dielectric layer. The via stop layer is an etch stop layer which is subject to photolithographic processing and anisotropic etching steps to provide openings to the first channels. The photoresist is then stripped.

A via dielectric layer is formed on the via stop layer. Again, where the via dielectric layer is of an oxide material, such as silicon oxide, the via stop layer is a nitride, such as silicon nitride, so the two layers can be selectively etched. The via dielectric layer is then subject to further photolithographic process and etching steps to form the pattern of the vias. The photoresist is then stripped.

A second channel dielectric layer is formed on the via dielectric layer. Again, where the second channel dielectric layer is of an oxide material, such as silicon oxide, the via stop layer is a nitride, such as silicon nitride, so the two layers can be selectively etched. The second channel dielectric layer is then subject to further photolithographic process and etching steps to simultaneously form second channel and via openings in the pattern of the second channels and the vias. The photoresist is then stripped.

An optional thin adhesion layer is deposited on the second channel dielectric layer and lines the second channel and the via openings.

A barrier layer is then deposited on the adhesion layer and lines the adhesion layer in the second channel openings and the vias.

Again, for conductor materials such as copper and copper alloys, which are deposited by electroplating, a seed layer is deposited by an electroless deposition process, physical vapor deposition (PVD) or ionized metal plasma (IMP) deposition on the barrier layer and lines the barrier layer in the second channel openings and the vias.

A second conductor material is deposited on the seed layer and fills the second channel openings and the vias.

A CMP process is then used to remove the second conductor material, the seed layer, and the barrier layer above the second channel dielectric layer to form the first channels. When a layer is placed over the second channels as a final layer, it is called a "cap" layer and the "dual" damascene process is completed.

The layer may be processed further for placement of additional levels of channels and vias over it.

The use of the single and dual damascene techniques eliminates metal etch and dielectric gap fill steps typically used in the metallization process. The elimination of metal etch steps is important as the semiconductor industry moves from aluminum (Al) to other metallization materials, such as copper, which are very difficult to etch.

A major problem occurs at smaller line geometries because the thickness of the barrier layer required to prevent detrimental diffusion of the conductor material into the dielectric layers is becoming a greater portion of the cross-section of the conductor channel. Since the barrier layer materials tend to have higher resistivities, the overall resistivity of the conductor channel increases disproportionately with conductor channel cross-section. The higher resistivities are becoming a limiting factor as the speed of integrated circuits increase in such applications as microprocessors.

Solutions to this problem has been long sought but has long eluded those skilled in the art.

DISCLOSURE OF THE INVENTION

The present invention provides an integrated circuit having a semiconductor substrate with a semiconductor device. A dielectric layer is on the semiconductor substrate and has an opening provided therein. A superconductor material barrier layer lines the opening and a seed layer is deposited to line the superconductor material barrier layer. A conductor core fills the opening over the barrier layer to form a conductor channel. The superconductor material barrier layer can be of yttrium barium copper oxide bonding to a low dielectric constant dielectric layer and to a copper seed layer.

The present invention further provides a method for manufacturing an integrated circuit having a semiconductor substrate with a semiconductor device. A dielectric layer is formed on the semiconductor substrate and an opening is formed in the dielectric layer. A barrier layer is deposited to line the opening. A seed layer is deposited on the superconductor material barrier layer and securely bonds to the superconductor material barrier layer. A conductor layer is deposited to fill the channel opening over the barrier layer. A planarization technique is used to planarize the superconductor material barrier, seed layer, and conductor layers to be coplanar with the dielectric layer to form a conductor channel. The superconductor material barrier layer can be of yttrium barium copper oxide deposited by a process, such as laser ablation (LA), chemical vapor deposition (CVD), atomic layer deposition (ALD), or self-ionized plasma (SIP) deposition on a low dielectric constant dielectric layer and having a copper seed layer deposited thereon by SIP deposition.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
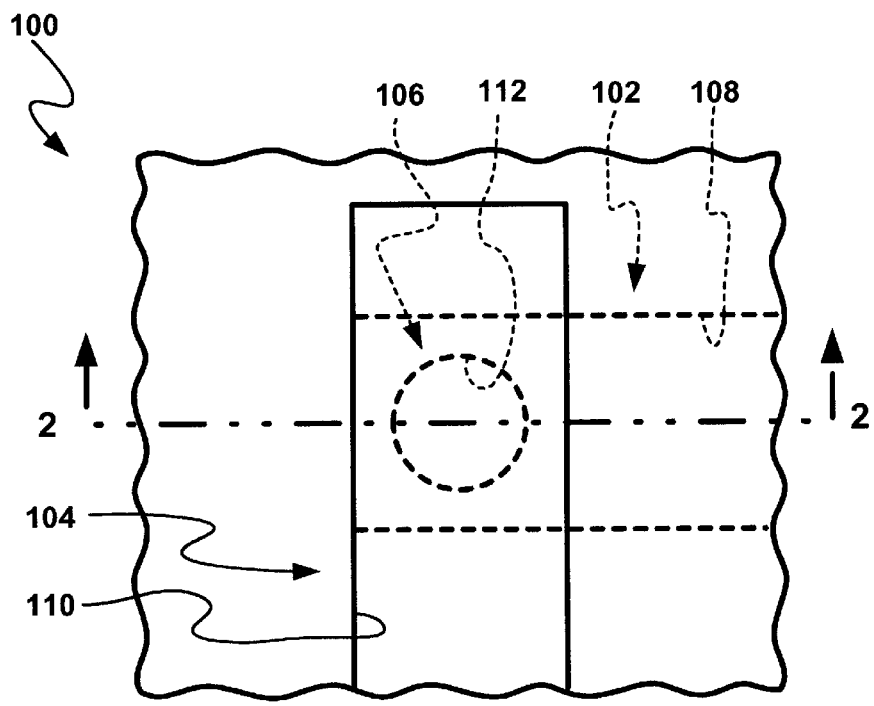
FIG. 1 (PRIOR ART) is a plan view of aligned channels with a connecting via.

Referring now to FIG. 1 (PRIOR ART), therein is shown a plan view of a semiconductor wafer 100 with a silicon semiconductor substrate (not shown) having as interconnects first and second channels 102 and 104 connected by a via 106. The first and second channels 102 and 104 are respectively disposed in first and second dielectric layers 108 and 110. The via 106 is an integral part of the second channel 104 and is disposed in a via dielectric layer 112.

The term "horizontal" as used in herein is defined as a plane parallel to the conventional plane or surface of a wafer, such as the semiconductor wafer 100, regardless of the orientation of the wafer. The term "vertical" refers to a direction perpendicular to the horizontal as just defined. Terms, such as "on", "above", "below", "side" (as in "sidewall"), "higher", "lower", "over", and "under", are defined with respect to the horizontal plane.

Figure 2:
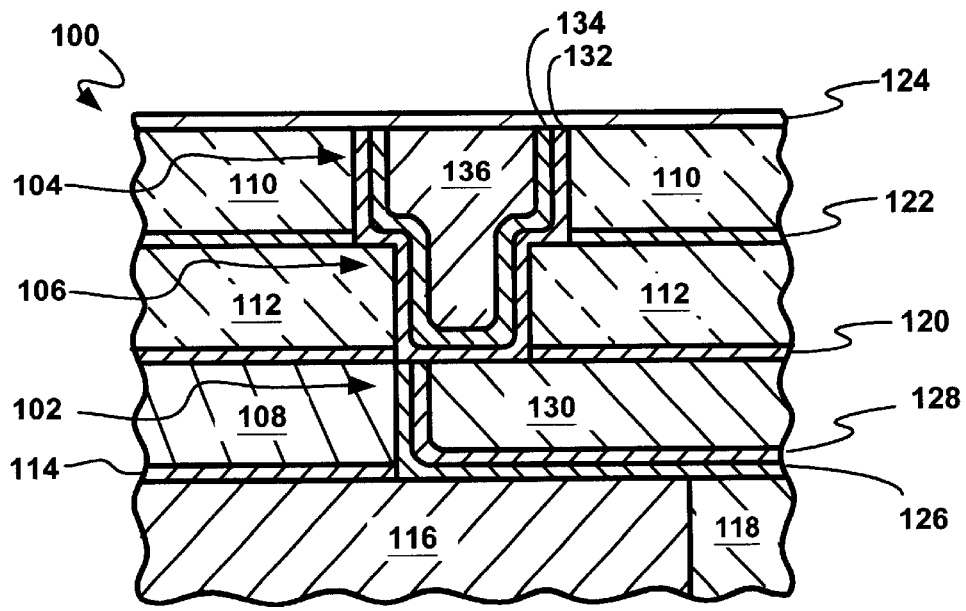
FIG. 2 (PRIOR ART) is a cross-section of FIG. 1 along line 2—2.

Referring now to FIG. 2 (PRIOR ART), therein is shown a cross-section of FIG. 1 (PRIOR ART) along line 2—2. A portion of the first channel 102 is disposed in a first channel stop layer 114 and is on a device dielectric layer 116. Generally, metal contacts are formed in the device dielectric layer 116 to connect to an operative semiconductor device (not shown). This is represented by the contact of the first channel 102 with a semiconductor contact 118 embedded in the device dielectric layer 116. The various layers above the device dielectric layer 116 are sequentially: the first channel stop layer 114, the first channel dielectric layer 108, a via stop layer 120, the via dielectric layer 112, a second channel stop layer 122, the second channel dielectric layer 110, and a next channel stop layer 124 (not shown in FIG. 1).

The first channel 102 includes a barrier layer 126, which could optionally be a combined adhesion and barrier layer, and a seed layer 128 around a conductor core 130. The second channel 104 and the via 106 include a barrier layer 132, which could also optionally be a combined adhesion and barrier layer, and a seed layer 134 around a conductor core 136. The barrier layers 126 and 132 are used to prevent diffusion of the conductor materials into the adjacent areas of the semiconductor device. The seed layers 128 and 134 form electrodes on which the conductor material of the conductor cores 130 and 136 is deposited. The seed layers 128 and 134 are of substantially the same conductor material of the conductor cores 130 and 136 and become part of the respective conductor cores 130 and 136 after the deposition.

The deposition of the barrier layer 132 is such that it fills the bottom of the via 106 at barrier layer portion 138 so as to effectively separate the conductor cores 130 and 136.

In the past, for copper conductor material and seed layers, highly resistive diffusion barrier materials such as tantalum nitride (TaN), titanium nitride (TiN), or tungsten nitride (WN) were used as barrier materials to prevent diffusion. At smaller line geometries, because the thickness of the barrier layer required to prevent detrimental diffusion of the conductor material into the dielectric layer is becoming a greater portion of the cross-section of the conductor channel, the overall resistivity of the conductor channel increases disproportionately with conductor channel cross-section. The higher resistivities are becoming a limiting factor as the speed of integrated circuits increase in such applications as microprocessors.

Figure 3:
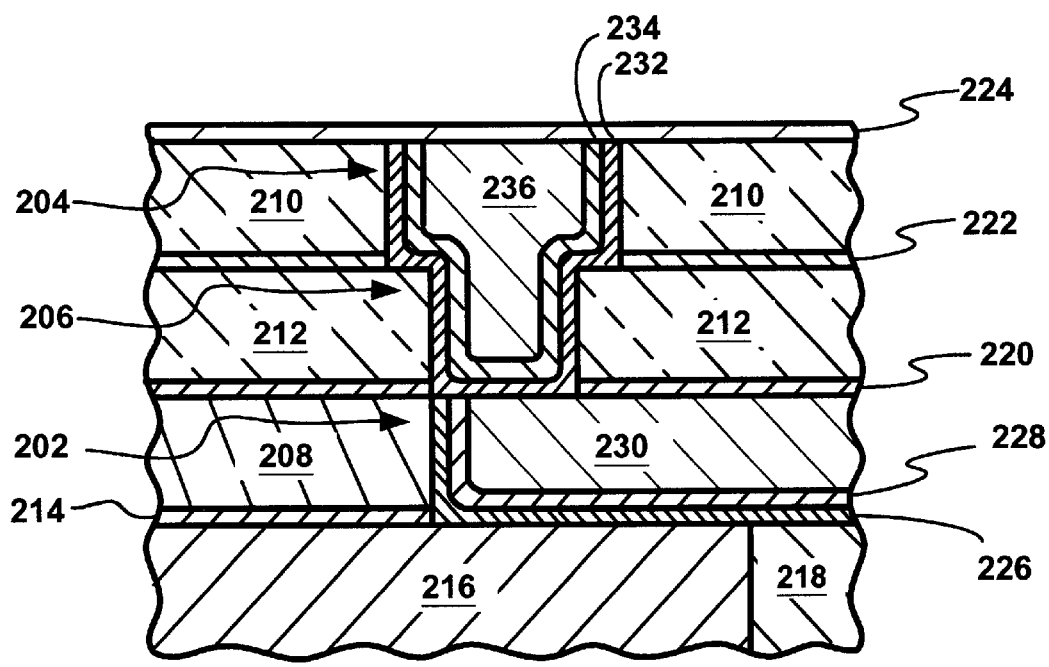
FIG. 3 is a cross-section showing the superconductor material barrier layer of the present invention.

Referring now to FIG. 3, therein is shown a cross-section similar to that shown in FIG. 2 (PRIOR ART) of a semiconductor wafer 200 of the present invention. The semiconductor wafer 200 has first and second channels 202 and 204 connected by a via 206. The first and second channels 202 and 204 are respectively disposed in first and second dielectric layers 208 and 210. The via 206 is a part of the second channel 204 and is disposed in a via dielectric layer 212.

A portion of the first channel 202 is disposed in a first channel stop layer 214 and is on a device dielectric layer 216. Generally, metal contacts (not shown) are formed in the device dielectric layer 216 to connect to an operative semiconductor device (not shown). This is represented by the contact of the first channel 202 with a semiconductor device gate 218 embedded in the device dielectric layer 216. The various layers above the device dielectric layer 216 are sequentially: the first channel stop layer 214, the first channel dielectric layer 208, a via stop layer 220, the via dielectric layer 212, a second channel stop layer 222, the second channel dielectric layer 210, and a next channel stop layer 224.

The first channel 202 includes a barrier layer 226 and a seed layer 228 around a conductor core 230. The second channel 204 and the via 206 include a barrier layer 232 and a seed layer 234 around a conductor core 236. The barrier layers 226 and 232 are used to prevent diffusion of the conductor materials into the adjacent areas of the semiconductor device. The seed layers 228 and 234 form electrodes on which the conductor material of the conductor cores 230 and 236 is deposited. The seed layers 228 and 234 are of substantially the same conductor material of the conductor cores 230 and 236 and become part of the respective conductor cores 230 and 236 after the deposition.

The barrier layers 226 and 232 are of high temperature oxide superconductor materials such as yttrium barium copper oxide. The materials are multi-layered ceramics and are considered "high temperature" because at temperatures of 77°–92° Kelvin they are superconductive.

The low dielectric constant dielectric layers 208, 212, and 210 are of materials such as TEOS (tetraethoxysilane), TMOS (tetramethoxysilane), OMCTS (octamethyleclotetrasiloxane), and DADBS (diaceloxyditerliarybutoxsilane). These materials are carried in a solvent fluid carrier such as MIBK (methyl isobutyl ketone). One of the more commonly used silicon-based, low dielectric constant materials is HSQ (hydrogen silsesquioxane) in MIBK solvent. A low dielectric constant material has a dielectric constant below 2.8 and is used to reduce capacitance effects which slow the operation of integrated circuits. Other low dielectric constant materials can be used.

The seed layers 228 and 234 and conductor cores 230 and 236 are of materials such as copper, copper-base alloys, gold, gold-base alloys, silver, silver-base alloys, and a combination thereof.

The method for manufacturing an integrated circuit having superconductor material barrier layers includes depositing the dielectric layer 208 over the semiconductor substrate by spin deposition.

After processing the dielectric layer 208 to harden it, a photolithographic process is used to form an opening in the dielectric layer 208. An ammonia ($NH_3$) plasma treatment is used to treat the low dielectric constant dielectric material in preparation for the deposition of the superconductor material barrier layer 226 to line the opening.

The superconductor material barrier layer 226 is deposited as a conformal barrier-liner by such processes as laser ablation (LA), chemical vapor deposition (CVD), atomic layer deposition (ALD), or self-ionized plasma (SIP) deposition. In the best mode for sub-0.18 μm geometry copper interconnects, the superconductor material barrier layer 226 is deposited to a thickness of from 50 Å to 300 Å.

The seed layer 228 is deposited on the superconductor material barrier layer 226 by a process, such as SIP deposition, to a thickness of from 500 to 700 Å to line the superconductor material barrier layer 226.

The conductor layer 230 is deposited to fill the channel opening over the superconductor material barrier layer 226 to a thickness of around 0.5 μm.

A planarization technique is used to planarize the superconductor material barrier 226, seed layer 228, and conductor layer 230 to be coplanar with the dielectric layer 208 to form the first channel 202.

The above steps are repeated for the dual damascene process except that the second channel and the via are formed simultaneously.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the spirit and scope of the included claims. All matters hitherto-fore set forth or shown in the accompanying drawings are to be interpreted in an illustrative and non-limiting sense.

The invention claimed is:

1. An integrated circuit comprising:
   a semiconductor substrate having a semiconductor device provided thereon;
   a dielectric layer formed on the semiconductor substrate having an opening provided therein;
   a high temperature superconductor material barrier layer lining the open and
   a conductor core filling the opening and connected to the semiconductor device.

2. The integrated circuit as claimed in claim 1 wherein the high temperature superconductor material barrier layer is of yttrium barium copper oxide.

3. The integrated circuit as claimed in claim 1 wherein the high temperature superconductor material barrier layer is of a thickness of from 50 Å to 300 Å.

4. The integrated circuit as claimed in claim 1 wherein the conductor core contains a material selected from a group consisting of copper, copper-base alloys, gold, gold-base alloys, silver, silver-base alloys, and a combination thereof.

5. The integrated circuit as claimed in claim 1 wherein the dielectric layer is formed of a low dielectric constant material.

6. An integrated circuit comprising:
   a silicon substrate having a semiconductor device provided thereon;
   a device dielectric layer formed on the silicon substrate;
   a channel dielectric layer formed on the device dielectric layer having a channel opening provided therein;
   a superconductor material barrier layer lining the channel opening; and
   a conductor core filling the channel opening and connected to the semiconductor device, the conductor core disposed over the superconductor material barrier layer.

7. The integrated circuit as claimed in claim 6 wherein the high temperature superconductor material barrier layer is of a multi-layered ceramic of yttrium barium copper oxide becoming superconductive at 77°–92° Kelvin.

8. The integrated circuit as claimed in claim 6 wherein the high temperature superconductor material barrier layer is of a thickness of from 50 Å to 300 Å.

9. The integrated circuit as claimed in claim 6 including a seed layer lining the superconductor material barrier layer, the seed layer and conductor core contain a material selected from a group consisting of copper, copper-base alloys, gold, gold-base alloys, silver, silver-base alloys, and a combination thereof.

10. The integrated circuit as claimed in claim 6 wherein the dielectric layer is formed of a low dielectric constant material selected from a group consisting of TEOS, TMOS, OMCTS, DADBS, HSQ, and a combination thereof.

* * * * *

UNITED STATES PATENT AND TRADEMARK OFFICE
CERTIFICATE OF CORRECTION

PATENT NO. : 6,518,648 B1
DATED : February 11, 2003
INVENTOR(S) : Lopatin

It is certified that error appears in the above-identified patent and that said Letters Patent is hereby corrected as shown below:

Column 6,
Line 33, delete "open" and insert therefore -- opening; --

Signed and Sealed this

First Day of July, 2003

JAMES E. ROGAN
*Director of the United States Patent and Trademark Office*